United States Patent
Kurokawa et al.

(10) Patent No.: US 6,499,133 B1
(45) Date of Patent: Dec. 24, 2002

(54) METHOD OF OPTIMIZING PLACEMENT OF ELEMENTS

(75) Inventors: Keiichi Kurokawa, Hyogo (JP); Masahiko Toyonaga, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/527,474

(22) Filed: Mar. 17, 2000

(30) Foreign Application Priority Data

Mar. 18, 1999 (JP) ............................................ 11-073462

(51) Int. Cl.[7] ............................. G06F 9/45; G06F 17/50
(52) U.S. Cl. ............................. 716/10; 326/38; 326/39; 327/99
(58) Field of Search ....................... 716/1–21; 326/38, 326/39; 327/99

(56) References Cited

U.S. PATENT DOCUMENTS

| | | | |
|---|---|---|---|
| 5,144,563 A | * | 9/1992 | Date et al. ....................... 716/9 |
| 5,796,625 A | * | 8/1998 | Scepanovic et al. ............ 716/9 |
| 6,088,519 A | * | 7/2000 | Koford ............................ 716/9 |
| 6,099,583 A | * | 8/2000 | Nag .............................. 716/16 |
| 6,209,123 B1 | * | 3/2001 | Maziasz et al. ................ 716/14 |

FOREIGN PATENT DOCUMENTS

| | | |
|---|---|---|
| JP | 1-260582 | 10/1989 |
| JP | 2-242474 | 9/1990 |

OTHER PUBLICATIONS

S. Kirkpatrick et al., "Optimization by Simulated Annealing", Science, vol. 220, No. 4598, pp. 671–680, May 1983.
M. Toyonaga et al., "Placement Optimization by Simulated Phase Transition", Technical Report of IEICE, CAS98–20, VLD98–20, DSP98–49, pp. 37–44, Jun. 1998, with an English abstract thereof.

* cited by examiner

Primary Examiner—Matthew Smith
Assistant Examiner—Helen B Rossoshek
(74) Attorney, Agent, or Firm—Nixon Peabody LLP; Donald R. Studebaker

(57) ABSTRACT

An initial arrangement is effected based on a net list and a cell library. Combination functions are extracted from a cost function. An optimum estimated temperature is calculated based on the difference between values of the cost function before and after two adjacent elements that have been selected randomly from elements to be arranged are interchanged in position, while near-optimum estimated temperatures are calculated based on the differences between respective values of the combination functions before and after the positional interchange. Of the near-optimum estimated temperatures, those lower than the optimum estimated temperature are recorded in a temperature schedule list together with the optimum estimated temperature. Thereafter, the Monte-Carlo method based on a random positional interchange between the elements to be arranged using the cost function is executed in order of the decreasing temperatures recorded in the temperature schedule list, whereby the initial arrangement is improved.

4 Claims, 3 Drawing Sheets

METHOD OF OPTIMIZING PLACEMENT OF ELEMENTS

BACKGROUND OF THE INVENTION

The present invention relates to a method of optimizing placement of elements in designing a semiconductor device.

As a method for combinational optimization, simulated annealing (SA) has been proposed (S. Kirkpatrick et al., "Optimization by Simulated Annealing", SCIENCE, Vol. 220, No. 4598, pp.671–680, May 1983). SA is a method of accomplishing combinational optimization by using the Monte-Carlo (MC) method, which is a method for a computer simulation in the field of thermodynamics. In the case of using an SA process to solve an element placement problem, the element placement problem is regarded as a physical problem and a cost function for evaluating element placement is regarded as an energy function. Then, an estimated temperature is determined and a physical structure (placement structure) of a state of thermal equilibrium at the temperature is evaluated by the MC method based on the energy function (cost function). An arrangement of elements having a low cost function is determined approximately on the analogy of a physical state which approaches a minimum energy state as the temperature is gradually decreased.

Although it has been proved that SA provides a good approximate solution, the problem is encountered that enormous processing time is required for the solution to converge because it is necessary to gradually reduce the estimated temperature from an extremely high level to a low level.

To solve the problem, a simulated phase transition (SPT) method in which an optimum estimated temperature is determined previously to the execution of the MC method has been proposed (M. Toyonaga et al., "Placement Optimization by Simulated Phase Transition", Technical Report of IEICE, CAS98-20, VLD98-20, DSP98-49, pp. 37–44, June 1998). In accordance with the SPT method, a temperature which improves the value of a cost function (cost value) most efficiently, i.e., an optimum estimated temperature Tc is determined first. By executing the MC method at the temperature Tc, the gradual cooling process from the extremely high temperature to the temperature Tc, which has been necessary in the case of implementing SA, becomes no more necessary.

In accordance with the SPT method described above, only one optimum estimated temperature Tc is obtained from one cost function. In addition, the temperature Tc is lower than the temperature at which the MC method in SA is initiated but higher than the temperature at which the approximate solution is obtained by it. In the SPT method, therefore, a new optimum estimated temperature Tc' (<Tc) is determine sequentially by repeatedly performing the fixation of part of element placement in a range of estimated temperatures not more than Tc. However, there are cases where the approximate solution obtained may be inferior to that obtained by SA if the standard for the fixation of element placement has randomness and the setting of the standard is inappropriate.

SUMMARY OF THE INVENTION

It is therefore an object of the present invention to allow easy determination of a temperature effectiv in executing the MC method in a range of temperatures lower than an optimum estimated temperature derived from a cost function and ensure the achievement of improved element placement.

To attain the object, the present invention extracts at least one combination function from one cost function and determines an optimum estimated temperature derived from the combination function, thereby allowing easy determination of the temperature effective in executing the MC method in a range of temperatures lower than the optimum estimated temperature Tc derived from the original cost function.

Specifically, a method of optimizing placement of elements in accordance with the present invention is a method of optimizing placement of elements in designing a semiconductor device by using a cost function for evaluating the placement of elements, the cost function being expressed as a sum of p (p is an integer not less than 2) partial functions and varying with an estimated temperature as a parameter, the method comprising: a first step of inputting a net list and a cell library and effecting an initial arrangement of elements to be arranged; a second step of extracting functions each expressed with either one of the p partial functions of the cost function or, when p is an integer not less than 3, expressed as a sum of a combination of not less than 2 and not more than (p-1) partial functions of the p partial functions of the cost function as q (q is an integer not less than 1 and not more than ($2^p-2$)) combination functions; a third step of randomly selecting two elements adjacent to each other from the elements to be arranged, calculating one optimum estimated temperature based on a difference between values of the cost function before and after the two elements are interchanged in position, and calculating q optimum estimated temperatures based on differences between respective values of the q combination functions before and after the interchange; a fourth step of recording, in a temperature schedule list, the temperatures of the q optimum estimated temperatures derived from the q combination functions which are lower than the optimum estimated temperature derived from the cost function together with the optimum estimated temperature derived from the cost function; and a fifth step of executing a Monte-Carlo method based on a random positional interchange between the elements to be arranged using the cost function in order of the decreasing temperatures recorded in the schedule list and thereby improving the initial arrangement.

The second step may include a step of extracting all or part of the p functions expressed with the respective p partial functions of the cost function as all or part of the q combination functions. When p is an integer not less tan 3, the second step may include a step of extracting all or part of ($2^p-p-2$) functions each expressed as a sum of a combination of not less than 2 and not more than (p-1) partial functions of the p partial functions of the cost function as all or part of the q combination functions.

Preferably, the fourth step includes a step of updating the temperature schedule such that a plurality of temperatures having a difference not exceeding a given threshold value therebetween are represented by one of the temperatures.

DETAILED DESCRIPTION OF THE INVENTION

Figure 1:
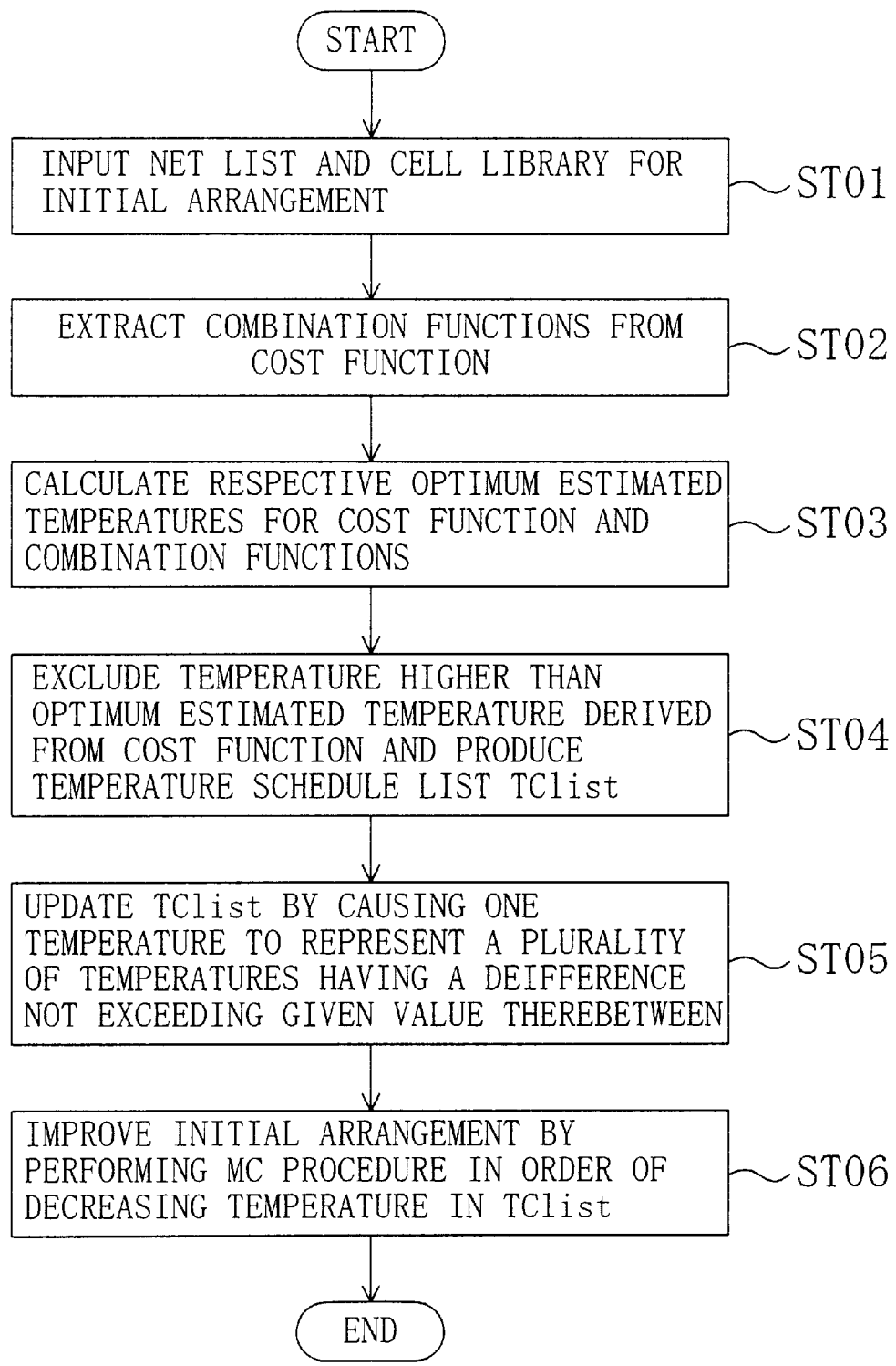
FIG. 1 is a flow chart showing an example of a method of optimizing placement of elements in accordance with the present invention.
Figure 2:
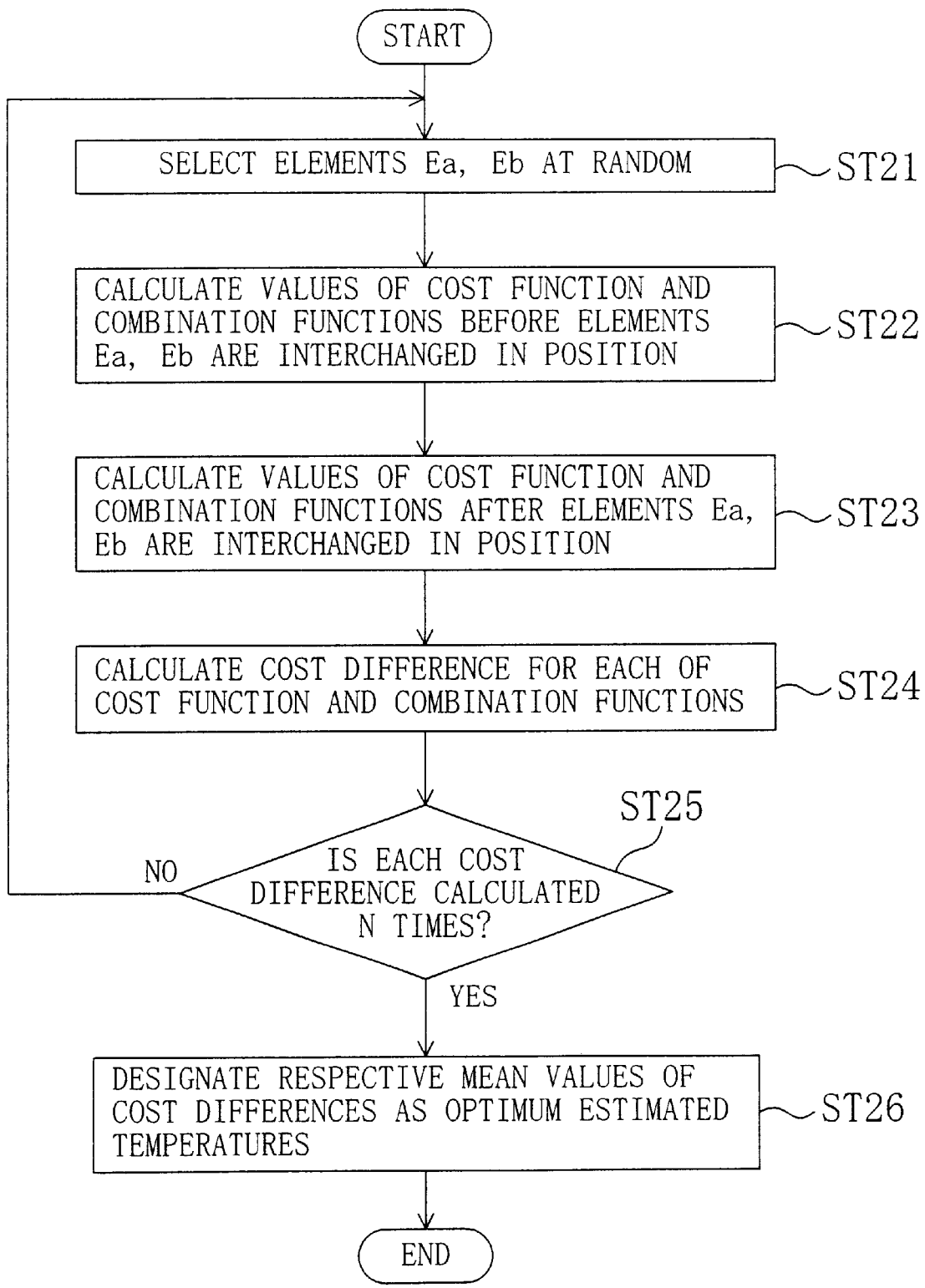
FIG. 2 is a flow chart illustrating in detail the process of calculating an optimum estimated temperature in FIG. 1.
Figure 3:
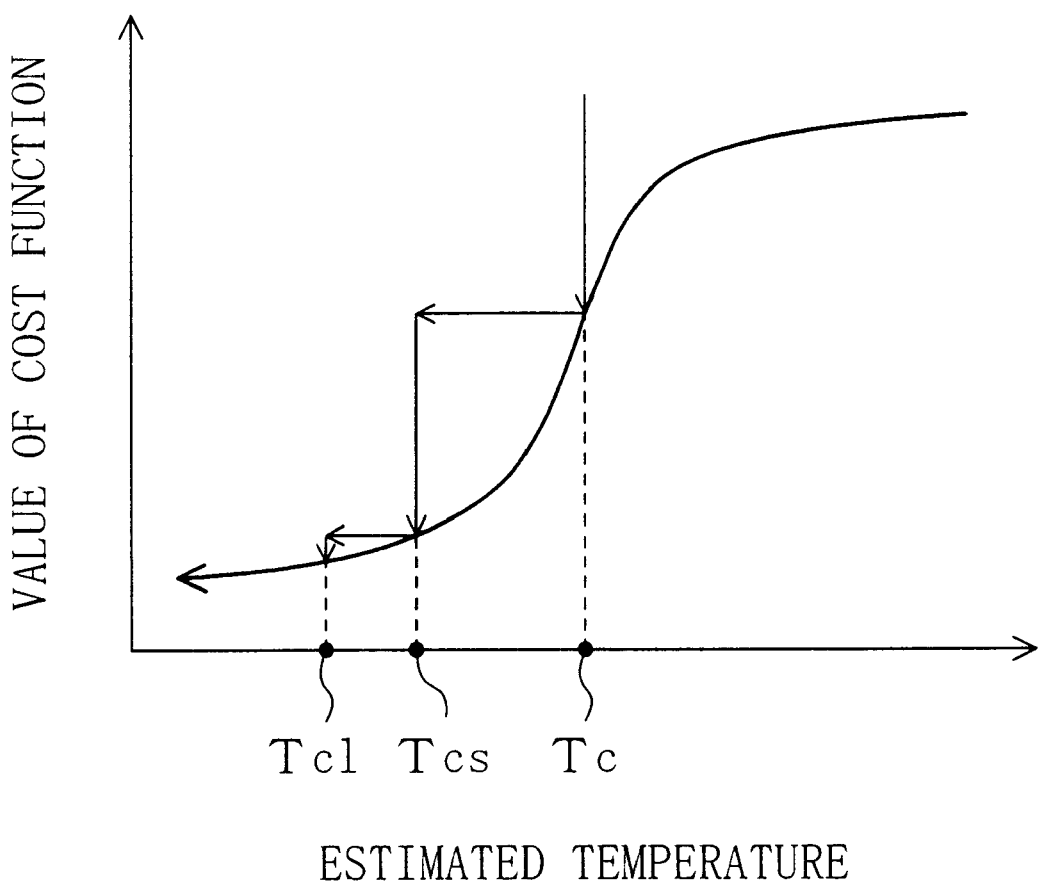
FIG. 3 illustrates an example of the process of optimizing placement of elements in accordance with the present invention.

Referring to FIGS. 1 to 3, an example of a method of optimizing placement of elements in accordance with the present invention will be described. Elements to be arranged are, e.g., standard cells. A description will be given to a placement problem associated with the allocation of elements to distinct regions (slots) arranged in a mesh-like configuration. For a simpler description, a cost function COST fore evaluating element placement is assumed to be expressed as the sum of two partial functions as follows:

$$\text{COST} = \alpha \times \Sigma Li + \beta \times \Sigma\{(Sj-Aj)^2\} \tag{1}$$

where Li is a wire length of an element-to-element interconnection i, Sj is the area of a slot j, Aj is the total area occupied by all the elements allocated in the slot j, and each of $\alpha$ and $\beta$ is a constant.

FIG. 1 shows the procedure of a method of optimizing placement of elements in the example. First, in Step ST01, a net list describing element-to-element interconnection data and a cell library in which cell data to be used in designing a semiconductor device is stored are input ted and a random arrangement of target elements is designated as an initial arrangement.

Next, in Step ST02, the cost function COST represented by the numerical expression (1) is decomposed into combination functions each with one partial function as represented by:

$$Gl = \Sigma Li \tag{2}$$

$$Gs = \Sigma\{(Sj-Aj)^2\} \tag{3}$$

whereby a first combination function Gl and a second combination function Gs are extracted.

Next, in Step ST03, two elements adjacent to each other are selected randomly from the elements to be arranged so that one optimum estimated temperature Tc is calculated based on the difference between the values of the cost function COST before and after the two elements are interchanged in position, while one optimum estimated temperature Tcl is calculated based on the difference between the values of the first combination function Gl before and after the interchange and one optimum estimated temperature Tcs is calculated based on the difference between the values of the second combination function Gs before and after the interchange. The calculation will be described later in greater detail. In the subsequent description, the respective optimum estimated temperatures Tcl and Tcs derived from the individual combination functions will be termed near-optimum estimated temperatures as appropriate to distinguish them from the optimum estimated temperature Tc derived from the cost function.

Next, in Step ST04, that one of the near-optimum estimated temperatures Tcl and Tcs lower than the optimum estimated temperature Tc is recorded together with the optimum estimated temperature Tc, whereby a temperature schedule list TClist is produced.

Next, in Step ST05, the temperature schedule list TClist is updated such that a plurality of temperatures having a difference not exceeding a given threshold value $\Delta T$ therebetween are represented by one of the temperatures. As the representative temperature, e.g., a mean temperature of the two temperatures or the higher one of the two temperatures is used.

Next, in Step ST06, the MC method based on a random positional interchange between the elements to be arranged using the cost function COST is executed in order of decreasing temperatures T recorded in the temperature schedule list TClist, whereby the initial arrangement is improved. More specifically, the two elements adjacent to each other are selected randomly from the elements to be arranged. After the two elements are interchanged in position, it is determined whether the positional interchange is acceptable. The MC method uses the following numerical expression (4) for determination:

$$\exp(-\Delta E/T) < \text{Rand } (1.0) \tag{4}$$

where $\Delta E$ is a variation in the cost function COST caused by a positional interchange at the temperature T and Rand (1.0) are uniform random numbers from 1 to 0. If the numerical expression (4) is established, the positional interchange is accepted. If the numerical expression (4) is not established, the process of returning the two elements to the original positions is performed without accepting the positional interchange. In either case, the arrangement after the process is determined to be a new arrangement. A positional interchange between the subsequent two elements and the determination of whether or not the positional interchange is acceptable are performed to determine a new arrangement and the determination is repeatedly performed N times (N is an integer) which is a specified improvement number of times. If m (m is an integer) temperatures are recorded in the temperature schedule list TClist, the positional improvement will be repeated a number of times corresponding to the product of N and m.

FIG. 2 shows the detailed procedure of the optimum estimated temperature calculation step ST03 in FIG. 1. In Step ST21, the two elements Ea, Eb adjacent to each other are selected randomly from the elements to be arranged.

Next, in Step ST22, the respective values of the cost function COST, the first combination function Gl, and the second combination function Gs before the two elements Ea, Eb are interchanged in position are calculated. It is assumed here that the respective values of the functions are COST1, Gl1, and Gs1.

Next, in Step ST23, the respective values of the cost function COST, the first combination function Gl, and the second combination function Gs after the two elements Ea, Eb are interchanged in position are calculated. It is assumed here that the respective values of the functions are COST2, Gl2, and Gs2.

Next, in Step ST24, the respective differences (cost differences) between the values of the cost function COST, between the values of the first combination function Gl, and between the values of the second combination function Gs before and after the two elements Ea, Eb are interchanged in position are calculated. If the respective cost differences are assumed to be dC, dGl, and dGs, they are represented by the following numerical expressions (5), (6), and (7).

$$dC = \text{COST2} - \text{COST1} \tag{5}$$

$$dGl = Gl2 - Gl1 \tag{6}$$

$$dGs = Gs2 - Gs1 \tag{7}$$

Next, in Step ST25, it is determined whether or not each of the cost differences dC, dGl, and dGs is calculated n (n is an integer) times as the specified number of times. If the answer is NO, the whole process returns to Step ST21. If the answer is YES, the whole process advances to Step ST26.

In Step ST26, respective means values of the cost differences dC, dGl, and dGs are designated as optimum estimated temperatures Tc, Tcl, and Tcs. That is, the following numerical expressions (8), (9), and (10) are established.

$$Tc = (\Sigma dC)/n \tag{8}$$

$$Tcl = (\Sigma dGl)/n \tag{9}$$

$$Tcs = (\Sigma dGs)/n \tag{10}$$

In calculating Tc using the numerical expression (8), it is assumed that only the cost differences dC having positive values are summed up. The same shall apply to the calculation of Tcl and Tcs using the numerical expressions (9) and (10). As a result, the optimum estimated temperature Tc derived from the cost function COST, the near-optimum estimated temperature Tcl derived from the first combination function Gl, and the near-optimum estimated temperature Tcs derived from the second combination function Gs are calculated.

FIG. 3 shows an example of the process of optimizing placement of elements in accordance with the present invention. In the drawing, the bold curve represents the value of the cost function COST varying with the estimated temperature. In accordance with the present invention, the arrangement of elements is first improved by executing the MC method at the optimum estimated temperature Tc. The element arrangement is then further improved by executing the MC method at the near-optimum estimated temperature Tcs and further improved by executing the MC method at the near-optimum estimated temperature Tcl. Here, it is assumed that Tcl<Tcs<Tc is satisfied and either of (Tc−Tcs) and (Tcs−Tcl) exceeds a given threshold value $\Delta T$. Accordingly, each of the three temperatures Tc, Tcl, and Tcs is recorded in the temperature schedule list TClist.

In the foregoing example, the calculation of the near-optimum estimated temperatures Tcl and Tcs derived from the respective combination functions is performed concurrently with the calculation of the optimum estimated temperature Tc derived from the cost function. Unlike the conventional SPT method, therefore, it is unnecessary to calculate a new optimum estimated temperature Tc' at the time point at which the execution of the MC method at the optimum estimated temperature Tc is completed. This allows a temperature effective in executing the MC method in a range of temperatures lower than the optimum estimated temperature Tc to be predetermined and achieves the effect of surely providing an element arrangement superior to that provided in accordance with the conventional SPT method. It is also possible to achieve further improvement by implementing simulated annealing from the temperature Tcl.

In the foregoing example, the cost function COST is expressed as the sum of two partial functions and the two functions Gl and Gs expressed with the respective two partial functions of the cost function COST are all extracted as the combination functions. However, it is also possible to improve the conventional SPT by adopting either one of the two functions Gl and Gs as a combination function and calculate a near-optimum estimated temperature derived from the combination function together with the optimum estimated temperature Tc.

In the case where the cost function is represented as the sum of three or more partial functions, the flexibility is further increased. In fact, a cost function include, in many cases, a partial function for reducing the length of a wire belonging to a path not satisfying a register-to-register path constraint, a partial function for reducing the length of a wire driven by an element with a high operability for lower power consumption, and the like in addition to the two partial functions.

In the case where the cost function is expressed as the sum of p partial functions (p is an integer not less than 3), q (q is an integer not less than 1 and not more than ($2^P$−2)) combination functions can be extracted. For example, it is possible to extract all or part of the p functions expressed with the respective p partial functions of the cost function as all or part the q combination functions. It is also possible to extract all or part of ($2^P$−p−2) functions expressed as the sum of a combination of not less than 2 and not more than (p−1) partial functions of the p partial functions of the cost function as all or part of the q combination functions. In the case where q is large, Step ST05 in FIG. 1 is useful in effectively reducing the number of near-optimum estimated temperatures recorded in the temperature schedule list TClist.

What is claimed is:

1. A method of optimizing placement of elements in designing a semiconductor device by using a cost function for evaluating the placement of elements, the cost function being expressed as a sum of p (p is an integer not less than 2) partial functions and varying with an estimated temperature as a parameter, the method comprising:

a first step of inputting a net list and a cell library and effecting an initial arrangement of elements to be arranged;

a second step of extracting functions each expressed with either one of the p partial functions of the cost function or, when p is an integer not less than 3, expressed as a sum of a combination of not less than 2 and not more than (p−1) partial functions of the p partial functions of the cost function as q (q is an integer not less than 1 and not more than ($2^P$−2)) combination functions;

a third step of randomly selecting two elements adjacent to each other from the elements to be arranged, calculating one optimum estimated temperature based on a difference between values of the cost function before and after the two elements are interchanged in position, and calculating q optimum estimated temperatures based on differences between respective values of the q combination functions before and after the interchange;

a fourth step of recording, in a temperature schedule list, the temperatures of the q optimum estimated temperatures derived from the q combination functions which are lower than the optimum estimated temperature derived from the cost function together with the optimum estimated temperature derived from the cost function; and a fifth step of executing a Monte-Carlo method based on a random positional interchange between the elements to be arranged using the cost function in order of the decreasing temperatures recorded in the schedule list and thereby improving the initial arrangement.

2. The method of claim 1, wherein the second step includes a step of, extracting all or part of the p functions expressed with the respective p partial functions of the cost function as all or part of the q combination functions.

3. The method of claim 1, wherein the second step includes a step of extracting, when p is an integer not less than 3, all or part of ($2^P$−p−2) functions each expressed as a sum of a combination of not less than 2 and not more than (p−1) partial functions of the p partial functions of the cost function as all or part of the q combination functions.

4. The method of claim 1, wherein the fourth step includes a step of updating the temperature schedule such that a plurality of temperatures having a difference not exceeding a given threshold value therebetween are represented by one of the temperatures.

* * * * *